(12) United States Patent
Erwin et al.

(10) Patent No.: US 9,214,385 B2
(45) Date of Patent: Dec. 15, 2015

(54) SEMICONDUCTOR DEVICE INCLUDING PASSIVATION LAYER ENCAPSULANT

(71) Applicant: International Business Machines Corporation, Armonk, NY (US)

(72) Inventors: Brian M. Erwin, Lagrangeville, NY (US); Karen P. McLaughlin, Poughkeepsie, NY (US); Ekta Misra, Carmel, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 10 days.

(21) Appl. No.: 14/202,067

(22) Filed: Mar. 10, 2014

(65) Prior Publication Data

US 2014/0183757 A1  Jul. 3, 2014

Related U.S. Application Data

(60) Continuation-in-part of application No. 13/873,801, filed on Apr. 30, 2013, now Pat. No. 8,674,506, which is a division of application No. 12/640,752, filed on Dec. 17, 2009, now Pat. No. 8,446,006.

(51) Int. Cl.
*H01L 21/768* (2006.01)
*H01L 23/485* (2006.01)
(Continued)

(52) U.S. Cl.
CPC ...... *H01L 21/7681* (2013.01); *H01L 21/76804* (2013.01); *H01L 21/76816* (2013.01); *H01L 23/3192* (2013.01); *H01L 23/5329* (2013.01); *H01L 23/53238* (2013.01); *H01L 23/53295* (2013.01); *H01L 24/03* (2013.01); *H01L 24/05* (2013.01); *H01L 23/5226* (2013.01); *H01L 24/11* (2013.01); *H01L 24/13* (2013.01);
(Continued)

(58) Field of Classification Search
CPC ............... H01L 21/76879; H01L 21/76801; H01L 21/76807; H01L 21/76808; H01L 2221/1015; H01L 2221/1036; H01L 2224/05006
See application file for complete search history.

(56) References Cited

U.S. PATENT DOCUMENTS

| | | | |
|---|---|---|---|
| 4,508,749 | A | 4/1985 | Brannon et al. |
| 4,954,142 | A | 9/1990 | Carr et al. |

(Continued)

FOREIGN PATENT DOCUMENTS

| | | |
|---|---|---|
| JP | 200216065 A | 1/2002 |
| WO | 2007064073 A1 | 6/2007 |

OTHER PUBLICATIONS

Bachmann, "Excimer lasers in a fabrication line for a highly integrated printed circuit board", Chemtronics, vol. 4, pp. 149-152, 1989.

(Continued)

*Primary Examiner* — Peniel M Gumedzoe
(74) *Attorney, Agent, or Firm* — Cantor Colburn LLP

(57) ABSTRACT

A method of fabricating a semiconductor device includes forming a passivation layer on a least one capping layer of the semiconductor device, and forming an encapsulant layer on the passivation layer. The method further includes patterning the encapsulant layer to expose a portion of the passivation layer and forming a final via opening in the passivation layer. A conductive material is deposited in the final via opening. The method further includes planarizing the conductive material until reaching a remaining portion of the encapsulant layer such that the conductive material is flush with the encapsulant layer and the passivation layer is preserved.

11 Claims, 10 Drawing Sheets

(51) Int. Cl.
  H01L 23/00 (2006.01)
  H01L 23/31 (2006.01)
  H01L 23/532 (2006.01)
  H01L 23/522 (2006.01)

(52) U.S. Cl.
  CPC . *H01L2221/1031* (2013.01); *H01L 2224/0401* (2013.01); *H01L 2224/05011* (2013.01); *H01L 2224/05012* (2013.01); *H01L 2224/05013* (2013.01); *H01L 2224/05094* (2013.01); *H01L 2224/05551* (2013.01); *H01L 2224/05552* (2013.01); *H01L 2224/05555* (2013.01); *H01L 2224/05558* (2013.01); *H01L 2224/05559* (2013.01); *H01L 2224/05572* (2013.01); *H01L 2224/05647* (2013.01); *H01L 2224/05655* (2013.01); *H01L 2224/05684* (2013.01); *H01L 2224/131* (2013.01); *H01L 2224/13111* (2013.01); *H01L 2224/13147* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01074* (2013.01); *H01L 2924/01075* (2013.01); *H01L 2924/01082* (2013.01)

(56) References Cited

U.S. PATENT DOCUMENTS

| | | |
|---|---|---|
| 5,302,547 A | 4/1994 | Wojnarowski et al. |
| 5,378,869 A | 1/1995 | Marrs et al. |
| 5,843,363 A | 12/1998 | Mitwalsky et al. |
| 6,071,809 A | 6/2000 | Zhao |
| 6,133,136 A | 10/2000 | Edelstein et al. |
| 6,298,551 B1 | 10/2001 | Wojnarowski et al. |
| 6,333,256 B2 | 12/2001 | Sandhu et al. |
| 6,365,956 B1 | 4/2002 | Nonaka |
| 6,522,021 B2 | 2/2003 | Sakihama et al. |
| 6,596,624 B1 | 7/2003 | Romankiw |
| 6,822,327 B1 | 11/2004 | Mithal et al. |
| 7,081,679 B2 | 7/2006 | Huang et al. |
| 7,208,402 B2 | 4/2007 | Bohr et al. |
| 7,208,843 B2 | 4/2007 | Richling et al. |
| 7,328,830 B2 | 2/2008 | Bachman et al. |
| 7,411,306 B2 | 8/2008 | Leu et al. |
| 7,541,272 B2 | 6/2009 | Daubenspeck et al. |
| 7,615,498 B2 * | 11/2009 | Sasaki et al. .......... 438/758 |
| 2002/0000668 A1 | 1/2002 | Sakihama et al. |
| 2002/0077798 A1 | 6/2002 | Inoue et al. |
| 2002/0158337 A1 * | 10/2002 | Babich et al. .......... 257/758 |
| 2003/0003768 A1 * | 1/2003 | Cho et al. ............... 438/778 |
| 2006/0012039 A1 | 1/2006 | Kim et al. |
| 2006/0249848 A1 | 11/2006 | Coolbaugh et al. |
| 2007/0001301 A1 | 1/2007 | Wang |
| 2008/0042271 A1 | 2/2008 | Dauksher et al. |
| 2008/0249727 A1 | 10/2008 | Takase |
| 2010/0203722 A1 * | 8/2010 | Bao et al. ............... 438/618 |

OTHER PUBLICATIONS

Brannon et al., "Excimer laser etching of polyimide", J. Appl. Phys. 58 pp. 2036-2043, 1985.

Gdula et al., "A 36-Chip Multiprocessor Multichip Module made with the General Electric High Density Interconnect Technology", Proceedings of the Electronic Components 2nd Technology Conference 41, pp. 727-730, 1991.

"Mini-Cu Vias for 3D Connections", IBM Technical Disclosure IPCOM000182403D, Anonymous, Apr. 29, 2009, pp. 1-4.

Price et al., "Damascene copper interconnects with polymer ILDs", Thin Solid Films, vol. 308-309, pp. 523-528, 1997.

* cited by examiner

US 9,214,385 B2

SEMICONDUCTOR DEVICE INCLUDING PASSIVATION LAYER ENCAPSULANT

CROSS-REFERENCE TO RELATED APPLICATION(S)

This application is a continuation-in-part of application Ser. No. 13/873,801, entitled "STRUCTURES AND METHODS TO REDUCE MAXIMUM CURRENT DENSITY IN A SOLDER BALL", filed on Apr. 30, 2013, which is a division of application Ser. No. 12/640,752, entitled "STRUCTURES AND METHODS TO REDUCE MAXIMUM CURRENT DENSITY IN A SOLDER BALL", filed on Dec. 17, 2009, which are assigned to same assignee as this application, and which the entire disclosures of all above-reference applications are hereby being incorporated by reference.

BACKGROUND

Conventional far back-end-of-line (FBEOL) processes for fabricating smaller scaled semiconductor devices (e.g., 32 nm and 22 nm) use aluminum pads that support a controlled collapse chip connection (C4) element and the corresponding underbump metallurgy (UBM). As dimensions of features (e.g., pads, wires, interconnects, vias, etc.) continue to shrink to create smaller devices, the maximum allowable current density decreases rapidly due to element electromigration (EM) effects. This crowding of current associated with the C4 and the aluminum pad and/or via structures often results in EM void formation, which can lead to increased resistance that negatively affects the performance of the semiconductor device.

SUMMARY

According to at least one embodiment, a method of fabricating a semiconductor device includes forming a passivation layer on a least one capping layer of the semiconductor device, and forming an encapsulant layer on the passivation layer. The method further includes patterning the encapsulant layer to expose a portion of the passivation layer and forming a final via opening in the passivation layer. A conductive material is deposited in the final via opening. The method further includes planarizing the conductive material until reaching a remaining portion of the encapsulant layer such that the conductive material is flush with the encapsulant layer and the passivation layer is preserved.

According to another embodiment, a method of fabricating a semiconductor device includes forming a passivation layer on a least one capping layer of the semiconductor device, and forming an encapsulant layer on the passivation layer. The method further includes patterning the encapsulant layer to expose a portion of the passivation layer and forming a final via opening in the passivation layer. A conductive material is deposited in the final via opening. The method further includes planarizing the conductive material until reaching a remaining portion of the encapsulant layer such that the conductive material is flush with the encapsulant layer and the passivation layer is preserved.

According to another embodiment, a semiconductor device comprises a passivation layer formed on at least one capping layer of the semiconductor device. An encapsulant layer is formed on the passivation layer, and a final via opening is formed in the passivation layer. A conductive material is deposited in the final via opening. The conductive material is flush with an upper surface of the encapsulant layer. The passivation layer has at least one preserved surface that is disposed against the encapsulant layer. The at least one preserved surface excluding at least one etched deformity.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
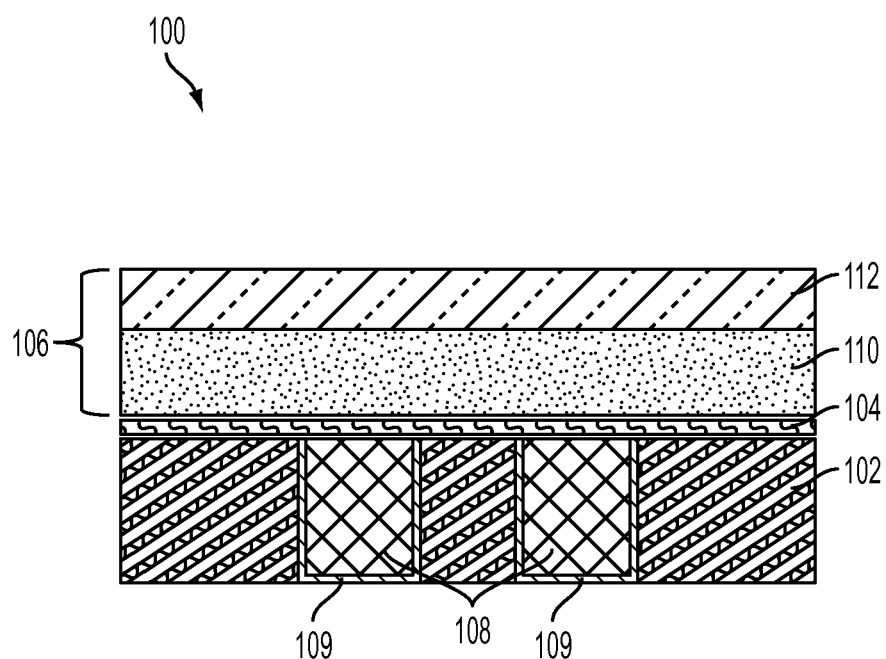
FIG. 1 is a cross-sectional view of a starting substrate including a film cap formed on contact pads disposed in a dielectric layer, and capping layers formed on an upper surface of the film cap.

With reference now to FIG. 1, a starting substrate 100 of is illustrated according to an exemplary embodiment. The starting substrate 100 includes a dielectric layer 102, a film cap 104, and one or more capping layers 106. The dielectric layer 102 is formed from a dielectric material including, but not limited to, doped silicon carbide, silicon nitride, low-k materials, TEOS, FTEOS, etc. According to at least one exemplary embodiment, a contact pad 108 is disposed in dielectric layer 104. The contact pad 108 is formed from any suitable conducting material including, but not limited to, copper, copper alloy, aluminum, etc. The contact pad 108 is formed in the dielectric layer 102 using one or more conventional semiconductor processing techniques, such as, for example, photolithography and reactive ion etch (RIE), chemical vapor deposition (CVD), plasma enhanced chemical vapor deposition (PECVD), and atomic layer deposition (ALD). According to at least one embodiment, an electrically conductive contact liner 109 is interposed between a respective contact pad 108 and the dielectric layer 102. The contact liner 109 is formed from one or more materials including, but not limited to, tantalum nitride (TaN), cobalt (Co), cobalt manganese (CoMn), titanium (Ti), titanium tungsten (TiW) and ruthenium (Ru). Various methods for depositing the contact liner 109 may be used including, but not limited to, plasma sputtering, evaporation, ALD and CVD.

The film cap 104 is formed on the dielectric layer 102 and contact pad 108. In embodiments, the film cap 104 is composed of silicon nitride ($SiN_x$) or a well-known composition referred to as NBLoK (e.g., SiC(N,H), or $SN_xC_yH_z$) deposited using conventional processes such as CVD, PECVD, ALD, etc. The film cap 104 may have any desired thickness (e.g., depth). The invention is not limited to the exemplary materials and processes described herein, and other materials and/or processes may be used to form the film cap 104 within the scope of the invention.

According to at least one exemplary embodiment, the capping layers 106 include a first capping layer 110 and a second capping layer 112. The first capping layer 110 is formed on the film cap 104 and is formed from, for example, silicon oxide ($SiO_x$). It appreciated, however, that other oxide materials may be used to form the first capping layer 110. The first capping layer 110 is deposited using various methods including, but not limited to, CVD, PECVD, ALD, etc. The first capping layer 110 has various thicknesses according to the desired application of the semiconductor device.

The second capping layer 112 is formed on the first capping layer 110, and is formed from, for example, $SiN_x$. Accordingly, the first capping layer 110 is interposed between the film cap 104 and the second capping layer 112. Although $SiN_x$ is an exemplary material for forming the second capping layer 112, it is appreciated that other nitride materials may be used. The second capping layer 112 is deposited using various methods including, but not limited to, CVD, PECVD, ALD, etc. The second capping layer 112 has various thicknesses according to the desired application of the semiconductor device.

Figure 2:
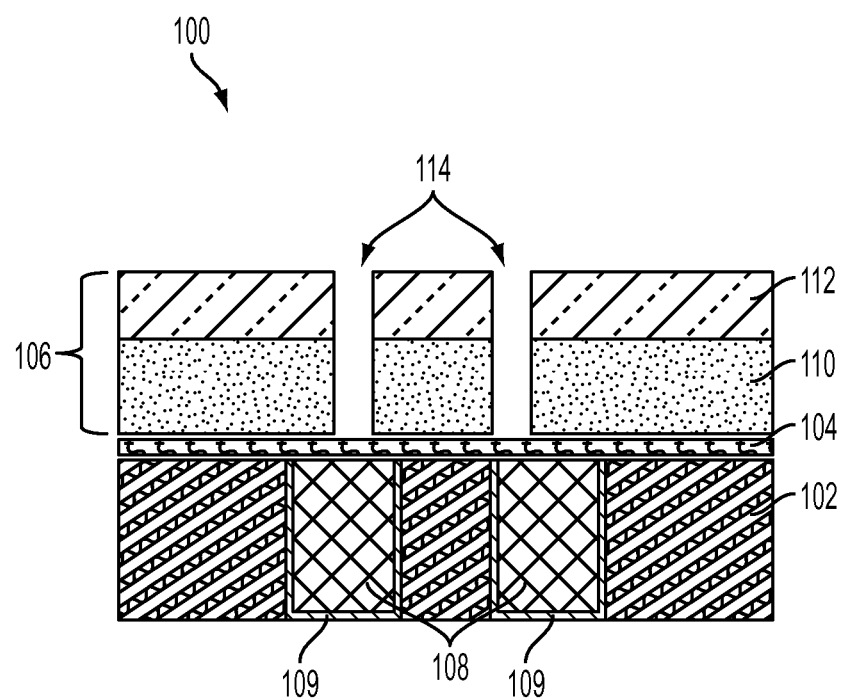
FIG. 2 illustrates the substrate of FIG. 1 following a first etching process that forms terminal via openings in the capping layers to expose an upper surface of the film cap.

Referring to FIG. 2, one or more via openings 114 (e.g., terminal via openings) are formed in the first capping layer 110 and the second capping layer 112. The via openings 114 may be formed using a RIE process, for example, that is selective to the material (e.g., nitride) of the film cap 104. In this regard, the via openings 114 are etched through the first and second capping layers 110, 112 and stop on the film cap 104.

Figure 3:
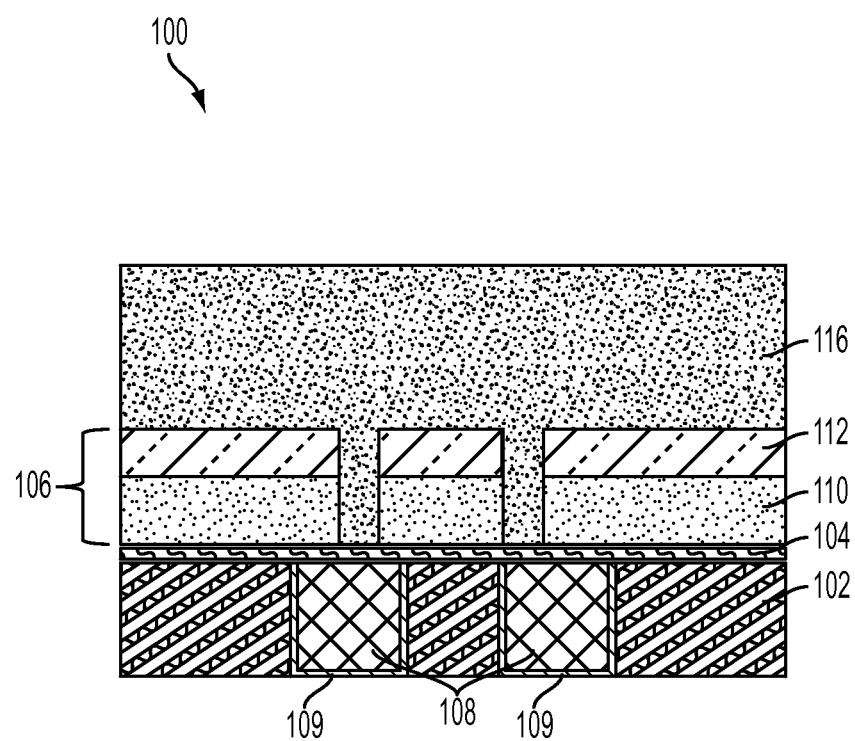
FIG. 3 illustrates the substrate of FIG. 2 after depositing a passivation layer on an upper surface of the capping layer and in the terminal via openings.

Turning to FIG. 3, a passivation layer 116 is formed on the second capping layer 112 and fills the via openings 114. According to at least one embodiment, the passivation layer 116 is composed of photosensitive polyimide (PSPI) and is deposited using conventional processes such, for example, as spin coating. The passivation layer 116 may be cured (e.g., baked) in order to toughen the passivation layer 116 (i.e., the PSPI), as understood by those ordinarily skilled in the art. The passivation layer 116 may have any desired thickness (e.g., depth). The invention is not limited to the exemplary materials and processes described herein, and other materials and/or processes may be used to form the passivation layer 116 within the scope of the invention, such as curtain coatings of other polymer passivation materials.

Figure 4:
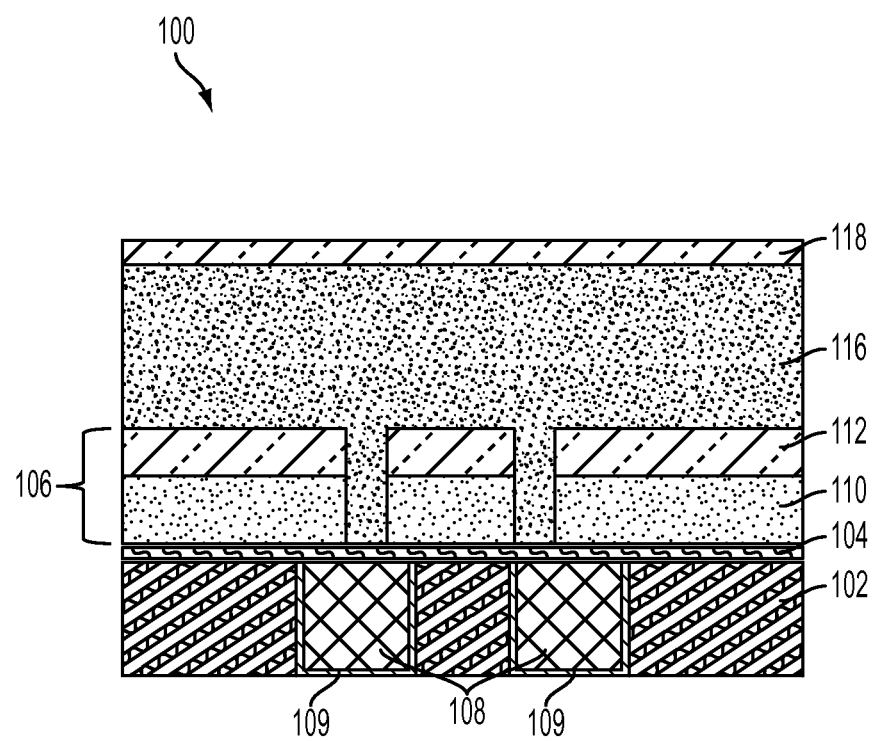
FIG. 4 illustrates the substrate of FIG. 3 after forming an encapsulant layer on an upper surface of the passivation layer.

Referring now to FIG. 4, an encapsulant layer 118 is formed on an upper portion of the passivation layer 116. The encapsulant layer 118 is formed from, for example, silicon nitride ($SiN_x$) and is deposited according to various deposition methods including, but not limited to, CVD, PECVD and ALD. The encapsulant layer 118 has a thickness of, for example, approximately 1000 angstroms (Å), and is configured to protect the passivation layer 116 during one or more subsequent process (e.g., chemical mechanical planarization), as described in greater detail below. According to at least one exemplary embodiment, the thickness of the encapsulant layer 118 is greater than a thickness of the film cap 104.

Figure 5:
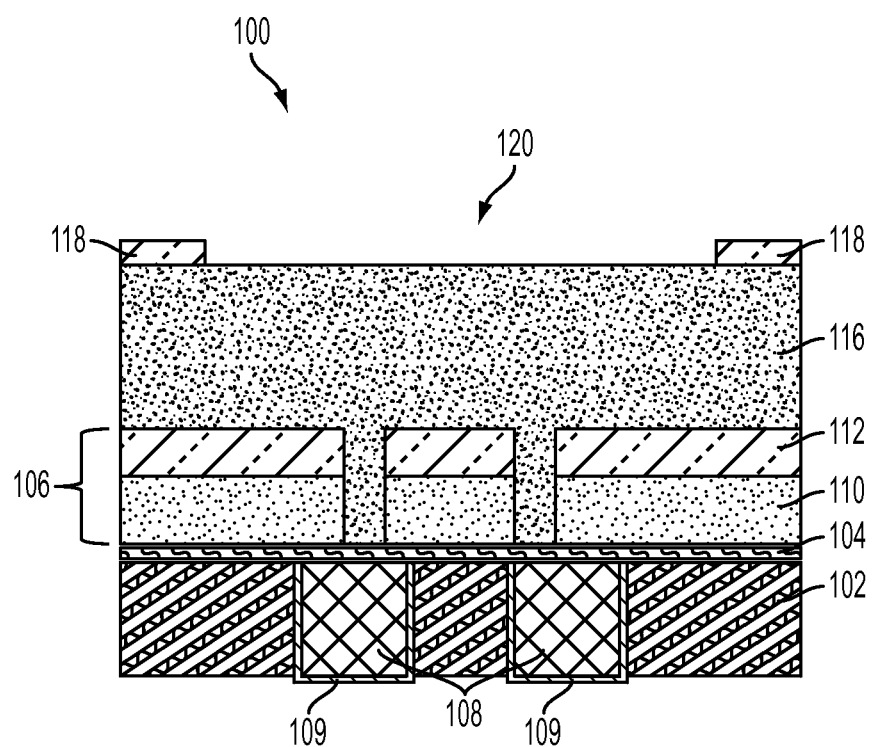
FIG. 5 illustrates the substrate of FIG. 4 after patterning the encapsulant layer to expose a portion of the underlying passivation layer.

Turning now to FIG. 5, the encapsulant layer 118 is patterned to form an opening 120 that exposes a portion of the underlying passivation layer 116. According to an embodiment, a conventional lithograph and RIE technique is used to form the opening 120 when the encapsulant layer 118 is thick, e.g., approximately 1000 Å or greater.

According to another embodiment, a laser-masking ablation process is used to form the opening 120 when the encapsulant layer 118 is thin, e.g., approximately 500 Å. In this regard, a patterned mask (not shown) formed from, for example, aluminum quartz, is interposed between a laser ablation tool and the encapsulant layer 118. The mask is patterned according to a desired patterning (e.g., opening 120) to be formed in the encapsulant layer 118. High energy pulses are generated by the laser ablation tools, and are delivered to the encapsulant layer 118 via the patterning of the mask. The pulsed energy heats and ablates the encapsulant layer 118. Accordingly, the desired pattern is formed in the encapsulation layer 118, thereby exposing the underlying passivation layer 116. The energy pulses are generated at wavelength of, for example, 308 nanometers (nm) UV energy, and include a range of fluences from approximately 0.1 to approximately 2.0 joules per square centimeter. The pulses have a duration ranging, for example, from approximately 15 nanoseconds (ns) to approximately 25 ns. Although an exemplary wavelength of 308 nm is described above, it is appreciated that the wavelength of the UV pulses includes all wavelengths produced by an excimer laser (i.e., exciplex laser) without limitation. For example, the UV energy pulses may range from approximately 126 nm to approximately 351 nm.

Figure 6:
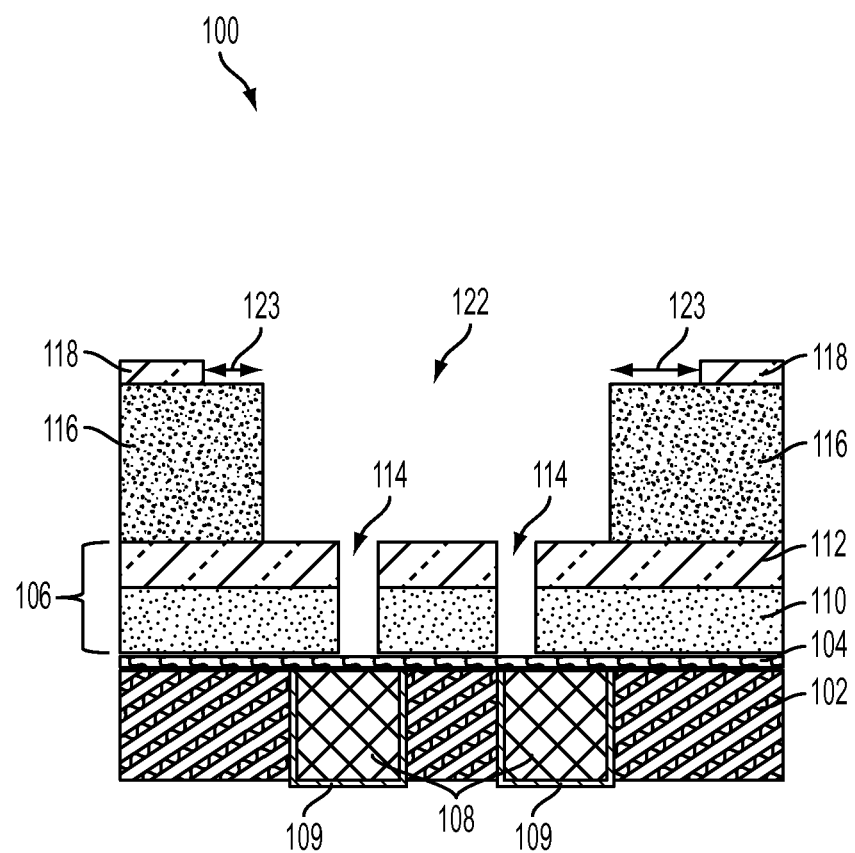
FIG. 6 illustrates the substrate of FIG. 5 following a second etching process that forms a first via opening in the passivation layer and that removes the passivation layer material from the terminal via openings.

Turning to FIG. 6, a first via etching process is performed which forms at least one final via (FV) opening 122 in the passivation layer 116. The first via etching process also removes the passivation layer 116 deposited in the via openings 114. The first via etch process is selective to the cap film 104 and the encapsulant layer 118. In this regard, a portion of the passivation layer 116 located beneath the encapsulant layer 118 is preserved (i.e., not etched) and a portion of the cap film 104 is exposed by a respective via opening 114. The first via etching process may be performed according to either a conventional lithograph and subsequent RIE process, or a laser-masking ablation process similar to the processes discussed above. If laser ablation process is used and the encapsulant layer is thin, e.g., less than 1000 A then the buffer regions 123 are created such that the laser beam used to create the via by ablating the passivation material doesn't cause localized heating and subsequent damage of the thin encapsulant close to the via opening. According to one embodiment, opposing walls of the final via opening 122 formed according to the laser-masking ablation process have an angle being less than 90 degrees with respect to the at least one capping layer, and the opposing walls are uniform with respect to one another.

According to at least one embodiment, opposing buffer regions 123 are formed in the passivation layer 116 as further illustrated in FIG. 6. The buffer regions 123 are formed, for example, by performing a laser-masking ablation process that uses a mask (e.g., an aluminum quartz mask). The mask (not shown) includes a pattern configured to form a desired FV opening (e.g., FV opening 122) in the passivation layer 116. The mask may include a solid portion that covers a portion of the passivation layer 116 extending between respective patterned edges of the encapsulant layer 118 to the edge of the FV opening 122. The covered portion, therefore, defines the formed buffer regions 123. The buffer regions 123 may have a length ranging from, for example, approximately 2 nm to approximately 3 nm.

Figure 7:
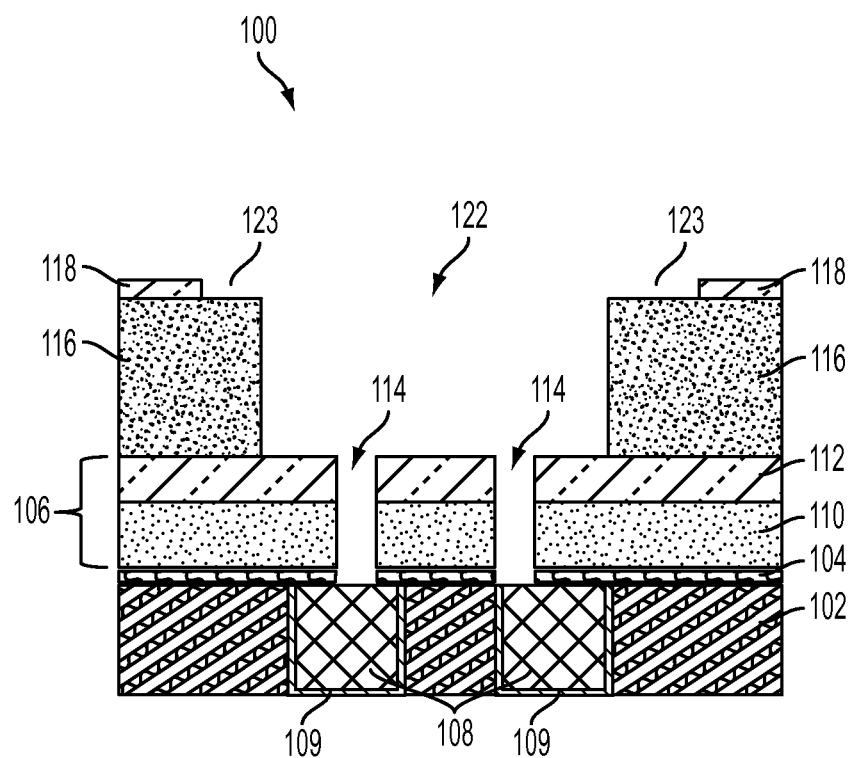
FIG. 7 illustrates the substrate of FIG. 6 following a third etching process that etches through the film cap and stops on the contact pads.

Referring now to FIG. 7, a second via etching process is performed which removes the cap film 104 exposed by a respective via openings 104. Accordingly, a portion of the underlying contact pad 108 is exposed. The second via etching process is performed, for example, using a RIE process that is selective to the passivation layer 112 and the capping layers 106. The film cap 104 and the encapsulant layer 118 are simultaneously etched. However, the encapsulant layer has thickness that is greater than the thickness of the film cap 104. In this regard, the film cap 104 is removed while the thickness of the encapsulant layer 118 remains with a reduced thickness.

Figure 8:
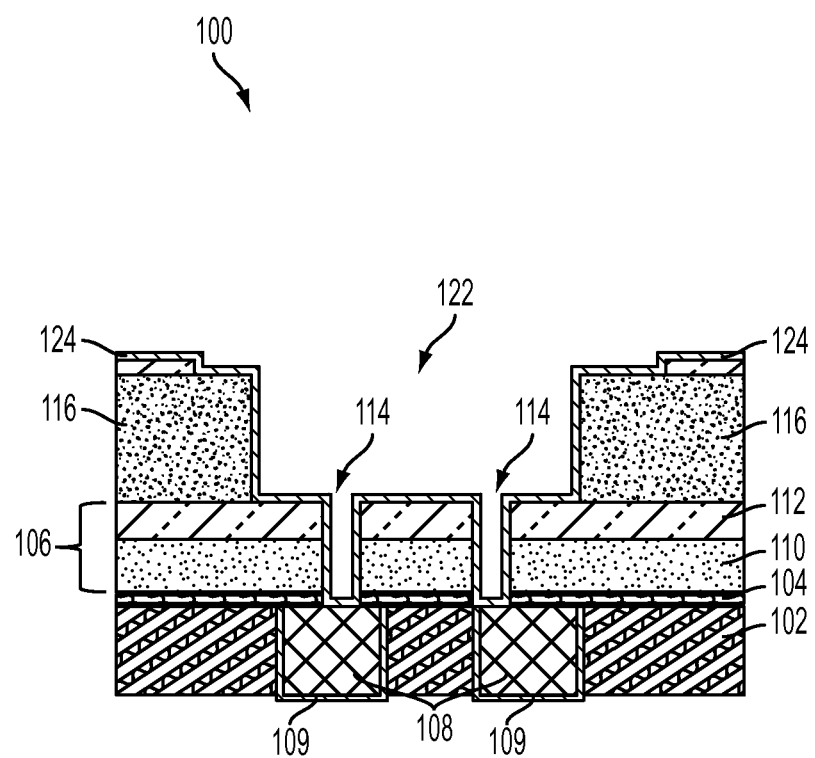
FIG. 8 illustrates the substrate of FIG. 7 after depositing a conductive liner that conforms to an upper surface of the encapsulant layer and to the surfaces of the passivation layer, capping layers and contact pads defined by the final via opening and the terminal via openings, respectively.

Turning to FIG. 8, an electrically conductive liner 124 is formed on the surfaces of the encapsulant layer 118 and passivation layer 116. The conductive liner 124 also conforms to exposed surfaces of the capping layer 106 and the contact pads 108 defined by the FV opening 122 and the via openings 114, respectively. The conductive liner 124 is formed from one or more materials including, but not limited to, tantalum nitride (TaN), cobalt (Co), cobalt manganese (CoMn), titanium (Ti), titanium tungsten (TiW) and ruthenium (Ru). Various methods for depositing the conductive liner 124 may be used including, but not limited to, plasma sputtering, evaporation, ALD and CVD.

Figure 9:
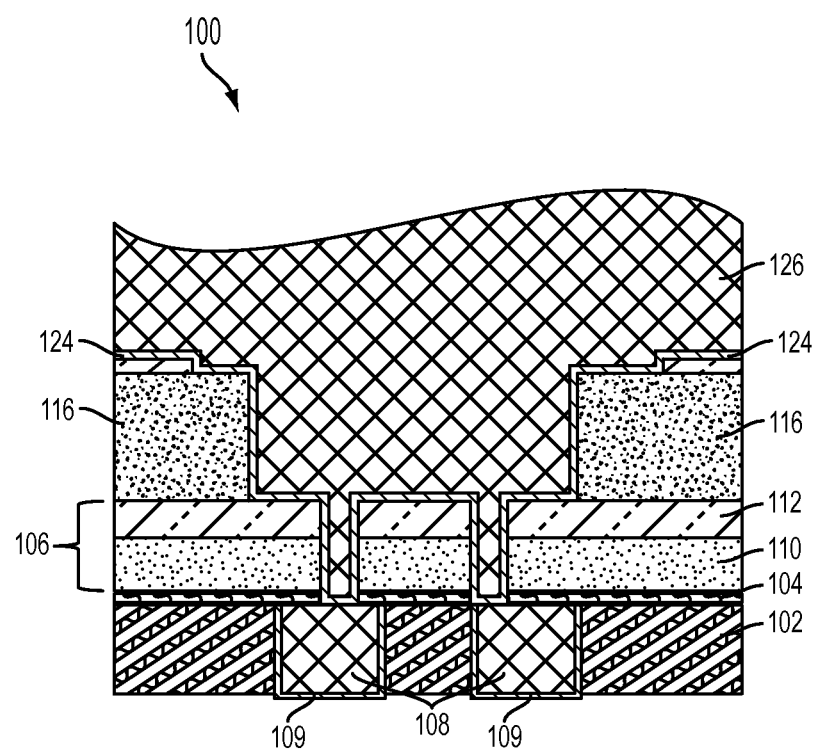
FIG. 9 illustrates the substrate of FIG. 8 after depositing a conductive material that fills the final via opening and the terminal via openings, and that covers the uppers surfaces of the passivation layer and the encapsulant layer.

Referring to FIG. 9, a conductive material 126 is deposited on the conductive liner 124. According to at least one embodiment, the conductive material 126 fills the via openings 114 and FV opening 122, and covers the upper surfaces of the passivation layer 116 and encapsulant layer 118. The conductive material 126 is formed using various processes including, for example, electroplating, and is annealed as understood by those ordinarily skilled in the art. According to one exemplary embodiment, the conductive material 126 is an electroplating material such as, for example, copper (Cu). It is appreciated, however, that the conductive material may comprise other conductive materials including, but not limited to, copper manganese (CuMn), gold (Au) and tin (Sn).

Figure 10:
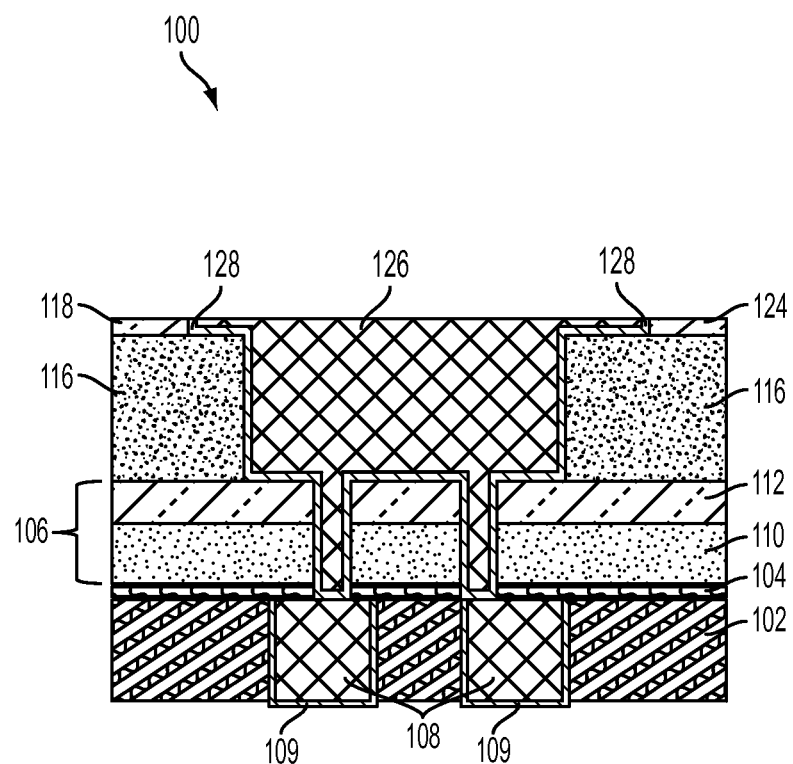
FIG. 10 illustrates the substrate of FIG. 9 following a planarization process that planarizes the conductive material and stops on the encapsulant layer.

Turning now to FIG. 10, excess conductive material 126 is planarized using a chemical planarization (CMP) process, for example. The encapsulant layer 118 acts as an etch stop (e.g., a CMP stop layer) that also protects the underlying passivation layer 116 from being recessed during the CMP process. That is, the CMP process stops on the encapsulant layer 118 such that the upper surface of the conductive material 126 is formed flush with the upper surface of the encapsulant layer 118, while the underlying passivation layer 116 is unaffected and preserved. As further illustrated in FIG. 10, the passivation layer has a preserved surface 128 that is disposed against the encapsulant layer 118. Since the encapsulant layer 118 protects the passivation layer 116 from the CMP process, the at least one preserved surface excludes at least one etched deformity which can result when being exposed to the CMP result.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:
    forming a passivation layer on at least one capping layer disposed on a substrate;
    forming an encapsulant layer on the passivation layer;
    forming opposing buffer regions on the passivation layer, the buffer regions defining therebetween an area of the passivation layer for forming a final via opening;
    after forming the buffer regions, patterning the encapsulant layer to expose a portion of the passivation layer and forming the final via opening in the passivation layer;
    depositing a conductive material in the final via opening; and
    planarizing the conductive material until reaching a remaining portion of the encapsulant layer such that the conductive material is flush with the encapsulant layer and the passivation layer is preserved.

2. The method of claim 1, wherein the planarizing is performed according to a chemical-mechanical planarization process, and wherein the encapsulant layer is formed from a nitride material that is resistant to the chemical-mechanical planarization process.

3. The method of claim 2, wherein forming the final via opening in the passivation layer includes selectively etching the passivation layer with respect to a material of the at least one capping layer and a material of the encapsulant layer such that an upper surface of the at least one capping layer is exposed.

4. The method of claim 3, further comprising forming a conductive liner on surfaces of the encapsulant layer and passivation layer, the conductive liner conforming to sidewalls of the passivation layer and the upper surface of the at least one capping layer defined by the final via opening.

5. The method of claim 4, wherein depositing the conductive material in the final via opening comprises performing an electroplating process that forms an electroplating material on the conductive liner such that the electroplated material fills the final via opening and covers the remaining portion of the encapsulant layer.

6. The method of claim 5, wherein planarizing the conductive material includes removing a portion of the conductive liner from an upper surface of the encapsulant layer and maintaining the encapsulant layer.

7. The method of claim 6, further comprising:
forming the at least one capping layer on a film cap that covers at least one contact pad disposed in a dielectric layer of the semiconductor device; and
forming, prior to forming the passivation layer, at least one terminal via opening in the at least one capping layer, the at least one terminal via opening exposing a portion of the film cap.

8. The method of claim 7, wherein the encapsulant layer has a thickness of no less than 1000 angstroms, and wherein the patterning the encapsulant layer is performed according to a reactive ion etching process.

9. The method of claim 7, wherein the encapsulant layer has a thickness less than 1000 angstroms, and wherein patterning the encapsulant layer is performed according to a laser-masking ablation process.

10. The method of claim 9, wherein the laser-masking ablation process includes exposing the encapsulant layer to pulsed UV energy having a wavelength ranging from about 126 nanometers to about 351 nanometers.

11. A method of fabricating a semiconductor device, the method comprising:
forming a passivation layer on at least one capping layer disposed on a substrate;
forming an encapsulant layer on the passivation layer;
forming opposing buffer regions on the passivation layer, the buffer regions defining therebetween an area of the passivation layer for forming a final via opening;
after forming the buffer regions, patterning the encapsulant layer to expose a portion of the passivation layer and forming the final via opening in the passivation layer;
depositing a conductive material in the final via opening; and
planarizing the conductive material until reaching a remaining portion of the encapsulant layer such that the conductive material is flush with the encapsulant layer and the passivation layer is preserved,
wherein the patterning the encapsulant layer is performed according to a laser-masking ablation process that includes exposing the encapsulant layer to pulsed UV energy having a wavelength ranging from about 126 nanometers to about 351 nanometers.

* * * * *